US012094708B2

(12) United States Patent
Hashimoto et al.

(10) Patent No.: US 12,094,708 B2
(45) Date of Patent: Sep. 17, 2024

(54) METHOD OF PROCESSING SUBSTRATE, SUBSTRATE PROCESSING APPARATUS, RECORDING MEDIUM, AND METHOD OF MANUFACTURING SEMICONDUCTOR DEVICE

(71) Applicant: HITACHI KOKUSAI ELECTRIC INC., Tokyo (JP)

(72) Inventors: Yoshitomo Hashimoto, Toyama (JP); Masaya Nagato, Toyama (JP)

(73) Assignee: KOKUSAI ELECTRIC CORPORATION, Tokyo (JP)

(*) Notice: Subject to any disclaimer, the term of this patent is extended or adjusted under 35 U.S.C. 154(b) by 530 days.

(21) Appl. No.: 15/921,168

(22) Filed: Mar. 14, 2018

(65) Prior Publication Data

US 2018/0269055 A1 Sep. 20, 2018

(30) Foreign Application Priority Data

Mar. 17, 2017 (JP) .................. 2017-053328

(51) Int. Cl.
C23C 16/455 (2006.01)
C23C 16/04 (2006.01)
(Continued)

(52) U.S. Cl.
CPC ........ H01L 21/0228 (2013.01); C23C 16/045 (2013.01); C23C 16/36 (2013.01);
(Continued)

(58) Field of Classification Search
None
See application file for complete search history.

(56) References Cited

U.S. PATENT DOCUMENTS

2011/0318505 A1 12/2011 Yamamoto et al.
2012/0149193 A1 6/2012 Fujiwara
(Continued)

FOREIGN PATENT DOCUMENTS

CN 103325676 A 9/2013
DE 102019121169 B4 * 5/2022 ........... H01L 21/314
(Continued)

OTHER PUBLICATIONS

Chinese Office Action issued Oct. 31, 2019 for the Chinese Patent Application No. 201810167006.6.
(Continued)

Primary Examiner — Bret P Chen
(74) Attorney, Agent, or Firm — Volpe Koenig

(57) ABSTRACT

There is provided a technique that includes: forming a film containing a main element, carbon and nitrogen on a pattern formed on a surface of a substrate by performing a cycle a predetermined number of times, the cycle including non-simultaneously performing: (a) forming a first layer containing the main element by supplying a precursor, which contains the main element constituting the film to be formed, to the substrate having the pattern; and (b) forming a second layer containing the main element, carbon and nitrogen by supplying a first reactant, which contains carbon and nitrogen, to the substrate so that a substance obtained by decomposing a portion of the first reactant is adsorbed on the first layer.

12 Claims, 8 Drawing Sheets

(51) Int. Cl.
*C23C 16/36* (2006.01)
*C23C 16/40* (2006.01)
*H01L 21/02* (2006.01)
*C23C 16/458* (2006.01)

(52) U.S. Cl.
CPC ...... *C23C 16/401* (2013.01); *C23C 16/45527* (2013.01); *C23C 16/45531* (2013.01); *H01L 21/02126* (2013.01); *H01L 21/02211* (2013.01); *C23C 16/4584* (2013.01)

(56) References Cited

U.S. PATENT DOCUMENTS

| | | | |
|---|---|---|---|
| 2013/0149873 A1 | 6/2013 | Hirose et al. | |
| 2013/0252435 A1* | 9/2013 | Shimamoto | B08B 7/00 438/758 |
| 2014/0170858 A1 | 6/2014 | Harada et al. | |
| 2014/0242809 A1 | 8/2014 | Hashimoto et al. | |
| 2014/0287598 A1* | 9/2014 | Hirose | H01L 21/02126 118/704 |
| 2014/0295667 A1 | 10/2014 | Kaga et al. | |
| 2015/0072537 A1* | 3/2015 | Noda | C23C 16/45561 438/786 |
| 2016/0071721 A1 | 3/2016 | Shimamoto et al. | |
| 2016/0284542 A1* | 9/2016 | Noda | H01J 37/3244 |
| 2016/0379868 A1 | 12/2016 | Sato et al. | |
| 2017/0040157 A1* | 2/2017 | Hashimoto | C23C 16/45527 |
| 2017/0047227 A1 | 2/2017 | Kaga et al. | |

FOREIGN PATENT DOCUMENTS

| | | | | |
|---|---|---|---|---|
| EP | 1746122 A1 * | 1/2007 | | C08G 77/50 |
| JP | 2012-124322 A | 6/2012 | | |
| JP | 2013-140944 A | 7/2013 | | |
| JP | 2014-165395 A | 9/2014 | | |
| JP | 2014-208883 A | 11/2014 | | |
| KR | 20110102415 A | 9/2011 | | |
| KR | 20170000351 A | 1/2017 | | |

OTHER PUBLICATIONS

Japanese Office Action dated Dec. 17, 2019 for the Japanese Patent Application No. 2017-053328.
Korean Office Action dated Feb. 18, 2019 for the Korean Patent Application No. 10-2018-0028041.
Taiwanese Office Action issued on Jan. 17, 2019 for the Taiwanese Patent Application No. 107106382.
Japanese Office Action issued on Jul. 29, 2020 for Japanese Patent Application No. 2017-053328.

* cited by examiner

When $T_B \leq T_A$

When $T_B > T_A$

METHOD OF PROCESSING SUBSTRATE, SUBSTRATE PROCESSING APPARATUS, RECORDING MEDIUM, AND METHOD OF MANUFACTURING SEMICONDUCTOR DEVICE

CROSS-REFERENCE TO RELATED APPLICATION(S)

This application is based upon and claims the benefit of priority from Japanese Patent Application No. 2017-053328, filed on Mar. 17, 2017, the entire contents of which are incorporated herein by reference.

TECHNICAL FIELD

The present disclosure relates to a method of manufacturing a semiconductor device, a substrate processing apparatus, and a recording medium.

BACKGROUND

As an example of processes of manufacturing a semiconductor device, a process of forming a film on a substrate is often carried out by non-simultaneously supplying a precursor and a reactant to the substrate.

When a film is formed on a substrate having a pattern formed on a surface of the substrate, there may occur a phenomenon that the thickness of a film to be formed becomes smaller (hereinafter, this phenomenon is also referred to as a "film thickness drop phenomenon") when compared with when a film is formed on a substrate having no pattern formed on the surface of the substrate.

SUMMARY

Some embodiments of the present disclosure provide a technique capable of suppressing occurrence of a film thickness drop phenomenon when a film is formed on a substrate having a pattern formed on a surface of the substrate.

According to one embodiment of the present disclosure, there is provided a technique that includes: forming a film containing a main element, carbon and nitrogen on a pattern formed on a surface of a substrate by performing a cycle a predetermined number of times, the cycle including non-simultaneously performing: (a) forming a first layer containing the main element by supplying a precursor, which contains the main element constituting the film to be formed, to the substrate having the pattern; and (b) forming a second layer containing the main element, carbon and nitrogen, by supplying a first reactant, which contains carbon and nitrogen to the substrate so that a substance obtained by decomposing a portion of the first reactant is adsorbed on the first layer, wherein in (b), the first reactant is supplied until a density of an adsorption layer of the substance formed on each of at least an upper surface, a side surface and a lower surface of the pattern is equalized.

DETAILED DESCRIPTION

One Embodiment of the Present Disclosure

One embodiment of the present disclosure will be described as below with reference to FIGS. 1 to 5.

(1) Configuration of the Substrate Processing Apparatus

Figure 1:
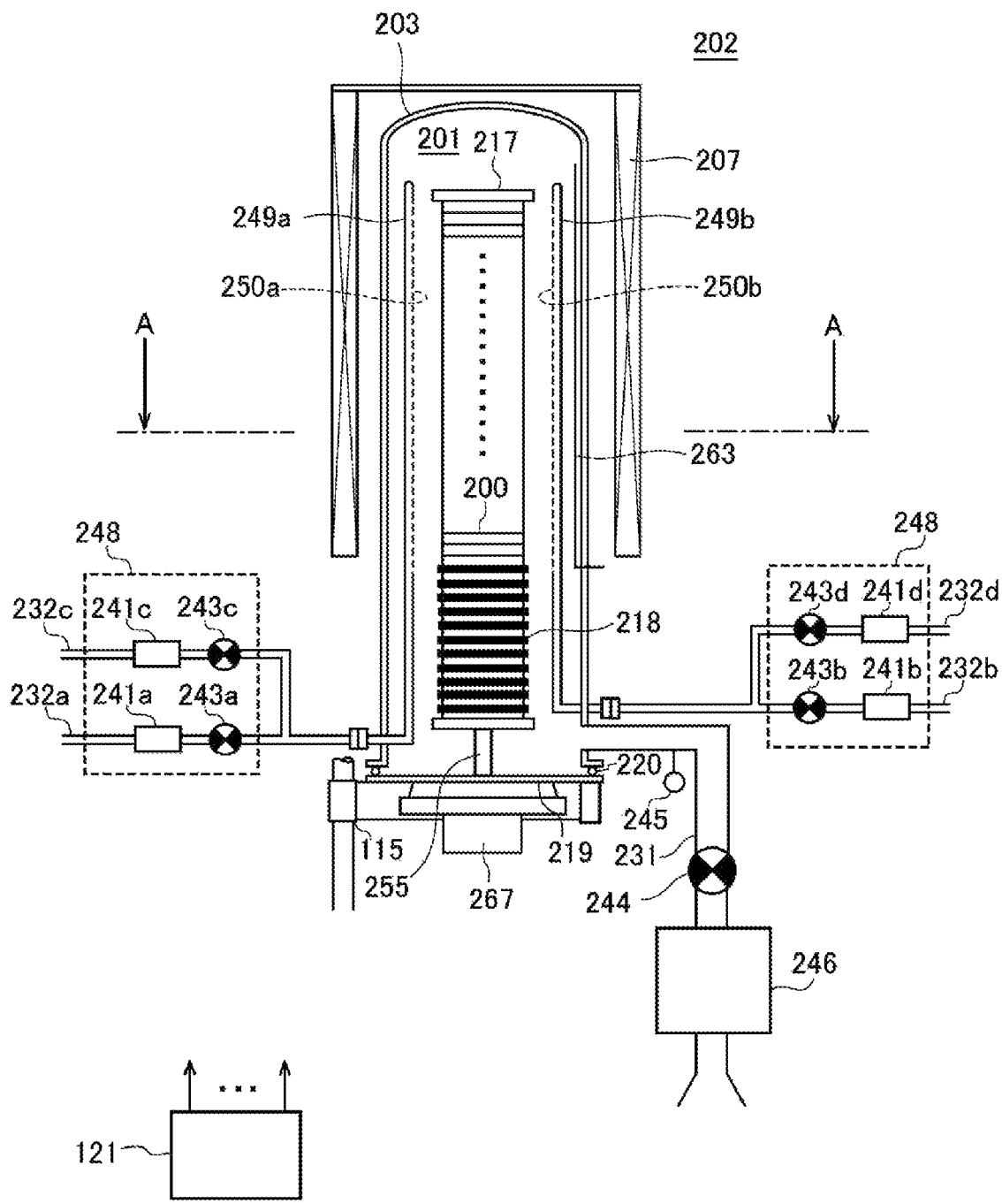
FIG. 1 is a schematic configuration diagram of a vertical type processing furnace of a substrate processing apparatus suitably used in an embodiment of the present disclosure, in which a portion of the processing furnace is shown in a vertical cross sectional view.

As illustrated in FIG. 1, a processing furnace 202 includes a heater 207 as a heating means (heating mechanism). The heater 207 has a cylindrical shape and is supported by a retaining plate so as to be vertically installed. The heater 207 functions as an activation mechanism (an excitation part) configured to thermally activate (excite) a gas.

A reaction tube 203 is disposed inside the heater 207 to be concentric with the heater 207. The reaction tube 203 is made of a heat resistant material such as, quartz ($SiO_2$), silicon carbide (SiC) or the like and has a cylindrical shape with its upper end closed and its lower end opened. A process chamber 201 is formed in a hollow cylindrical portion of the reaction tube 203. The process chamber 201 is configured to accommodate wafers 200 as substrates.

Nozzles 249a and 249b are installed in the process chamber 201 so as to penetrate a sidewall of the lower portion of the reaction tube 203. Gas supply pipes 232a and 232b are connected to the nozzles 249a and 249b, respectively.

Mass flow controllers (MFCs) 241a and 241b, which are flow rate controllers (flow rate control parts), and valves 243a and 243b, which are opening/closing valves, are installed to the gas supply pipes 232a and 232b, respectively, sequentially from upstream sides of the gas supply pipes 232a and 232b. Gas supply pipes 232c and 232d, which supply an inert gas, are connected to the gas supply pipes 232a and 232b, respectively, at downstream side of the valves 243a and 243b. MFCs 241c and 241d, and valves 243c and 243d are installed to the gas supply pipes 232c and 232d, respectively, sequentially from upstream sides of the gas supply pipes 232c and 232d.

Figure 2:
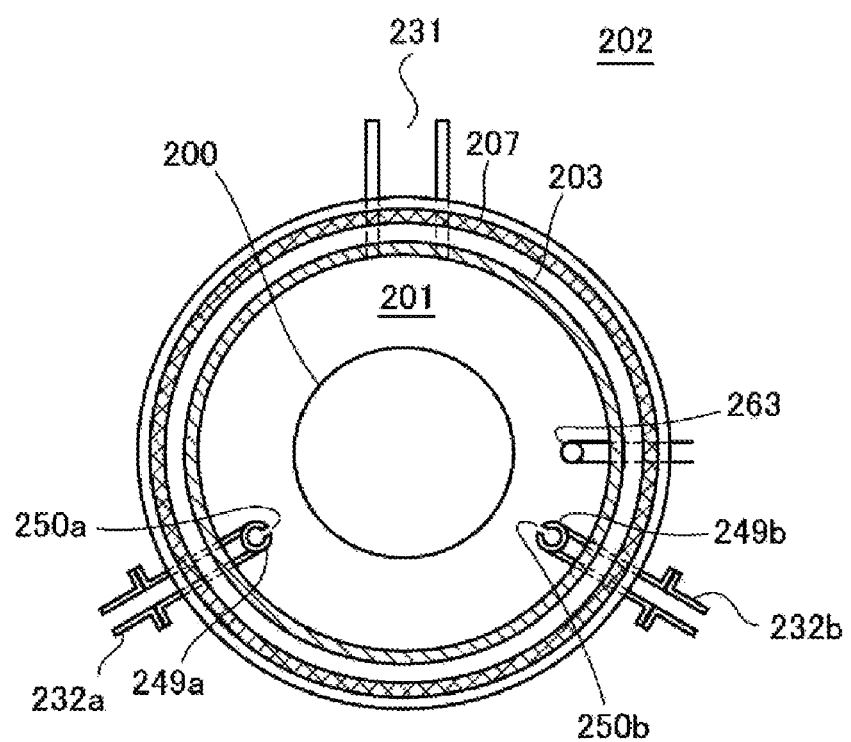
FIG. 2 is a schematic configuration diagram of a portion of the vertical type processing furnace of the substrate processing apparatus suitably used in an embodiment of the present disclosure, in which a portion of the processing furnace is shown in a cross sectional view taken along line A-A in FIG. 1.

As illustrated in FIG. 2, the nozzles 249a and 249b are respectively disposed in a space with an annular plan-view shape between the inner wall of the reaction tube 203 and the wafers 200 such that the nozzle 249a extends upward along a stacking direction of the wafers 200 from a lower portion of the inner wall of the reaction tube 203 to an upper portion of the inner wall of the reaction tube 203. That is, the nozzles 249a and 249b are installed at a lateral side of a wafer arrangement region in which the wafers 200 are arranged, namely in a region which horizontally surrounds the wafer arrangement region, so as to extend along the wafer arrangement region. Gas supply holes 250a and 250b for supplying a gas are formed on the side surfaces of the nozzles 249a and 249b, respectively. The gas supply holes 250a and 250b are opened toward the center of the reaction tube 203 so as to allow a gas to be supplied toward the wafers 200. The gas supply holes 250a and 250b may be formed in a plural number between the lower portion of the reaction tube 203 and the upper portion of the reaction tube 203.

A halosilane-based precursor gas, which contains silicon (Si) as a main element and a halogen element constituting a film to be formed, is supplied as a precursor (precursor gas) from the gas supply pipe 232a into the process chamber 201 via the MFC 241a, the valve 243a and the nozzle 249a. The precursor gas refers to a gaseous precursor, for example, a gas obtained by vaporizing a precursor which remains in a liquid state under a room temperature and an atmospheric pressure, or a precursor which remains in a gas state under the room temperature and the atmospheric pressure. The halogen element may include chlorine (Cl), fluorine (F), bromine (Br), iodine (I), and the like. As the halosilane-based gas, it may be possible to use, for example, a chlorosilane-based gas containing Cl. As the chlorosilane-based gas, it may be possible to use, for example, hexachlorodisilane ($Si_2Cl_6$, abbreviation: HCDS) gas.

An amine-based gas, which contains carbon (C) and nitrogen (N), is supplied as a first reactant (first reaction gas) from the gas supply pipe 232b into the process chamber 201 via the MFC 241b, the valve 243b, and the nozzle 249b. The amine-based gas is composed of three elements of N, C and H. As the amine-based gas, it may be possible to use, for example, triethylamine (($C_2H_5)_3N$, abbreviation: TEA) gas.

An oxidizing gas (oxidizing agent), which is a gas containing oxygen (O), is supplied as a second reactant (second reaction gas) from the gas supply pipe 232b into the process chamber 201 via the MFC 241b, the valve 243b, and the nozzle 249b. As the oxidizing gas, it may be possible to use, for example, oxygen ($O_2$) gas.

An inert gas is supplied from the gas supply pipes 232c and 232d into the process chamber 201 via the MFCs 241c and 241d, the valves 243c and 243d, the gas supply pipes 232a and 232b, and the nozzles 249a and 249b. As the inert gas, it may be possible to use, for example, nitrogen ($N_2$) gas.

A precursor supply system mainly includes the gas supply pipe 232a, the MFC 241a, and the valve 243a. Each of first and second reactant supply systems mainly includes the gas supply pipe 232b, the MFC 241b, and the valve 243b. An inert gas supply system mainly includes the gas supply pipes 232c and 232d, the MFCs 241c and 241d, and the valves 243c and 243d.

One or all of various kinds of supply systems described above may be configured as an integrated supply system 248 in which the valves 243a to 243d, the MFCs 241a to 241d, and the like are integrated. The integrated supply system 248 is connected to each of the gas supply pipes 232a to 232d and is configured such that the supply operations of various kinds of gases into the gas supply pipes 232a to 232d, i.e., the opening/closing operation of the valves 243a to 243d, the flow rate adjusting operation by the MFCs 241a to 241d, and the like, are controlled by a controller 121 which will be described later. The integrated supply system 248 is configured as an integral type or division type integrated unit, and is detachable from the gas supply pipes 232a to 232d and the like on an integrated unit basis such that the maintenance, replacement, expansion or the like of the integrated supply system 248 can be performed on an integrated unit basis.

An exhaust pipe 231 configured to exhaust the internal atmosphere of the process chamber 201 is installed in the reaction tube 203. A vacuum pump 246 as a vacuum exhaust device is connected to the exhaust pipe 231 via a pressure sensor 245 as a pressure detector (pressure detection part) which detects the internal pressure of the process chamber 201 and an auto pressure controller (APC) valve 244 as a pressure regulator (pressure regulation part). The APC valve 244 is configured so that the vacuum exhaust and the vacuum exhaust stop of the interior of the process chamber 201 can be performed by opening and closing the APC valve 244 while operating the vacuum pump 246 and so that the internal pressure of the process chamber 201 can be adjusted by adjusting the opening degree of the APC valve 244 based on the pressure information detected by the pressure sensor 245 while operating the vacuum pump 246. An exhaust system mainly includes the exhaust pipe 231, the APC valve 244 and the pressure sensor 245. The vacuum pump 246 may be regarded as being included in the exhaust system.

A seal cap 219, which serves as a furnace opening cover configured to hermetically seal a lower end opening of the reaction tube 203, is installed under the reaction tube 203. The seal cap 219 is made of a metal material such as, stainless steel (SUS) or the like, and is formed in a disc shape. An O-ring 220, which is a seal member making contact with the lower end portion of the reaction tube 203, is installed on an upper surface of the seal cap 219. A rotation mechanism 267 configured to rotate a boat 217, which will be described later, is installed under the seal cap 219. A rotary shaft 255 of the rotation mechanism 267, which penetrates the seal cap 219, is connected to the boat 217. The rotation mechanism 267 is configured to rotate the wafers 200 by rotating the boat 217. The seal cap 219 is configured to be vertically moved up and down by a boat elevator 115 which is an elevator mechanism installed outside the reaction tube 203. The boat elevator 115 is configured as a transfer device (transfer mechanism) which loads and unloads (transfers) the wafers 200 into and from the process chamber 201 by moving the seal cap 219 up and down.

The boat 217 serving as a substrate support is configured to support a plurality of wafers 200, e.g., 25 to 200 wafers, in such a state that the wafers 200 are arranged in a horizontal posture and in multiple stages along a vertical direction with the centers of the wafers 200 aligned with one another. That is, the boat 217 is configured to arrange the wafers 200 in a spaced-apart relationship. The boat 217 is made of a heat resistant material such as, quartz or SiC. Heat insulating plates 218 made of a heat resistant material such as, quartz or SiC are installed below the boat 217 in multiple stages.

A temperature sensor 263 serving as a temperature detector is installed in the reaction tube 203. Based on temperature information detected by the temperature sensor 263, a state of supplying electric power to the heater 207 is adjusted such that the interior of the process chamber 201 has a desired temperature distribution. The temperature sensor 263 is installed along the inner wall of the reaction tube 203.

Figure 3:
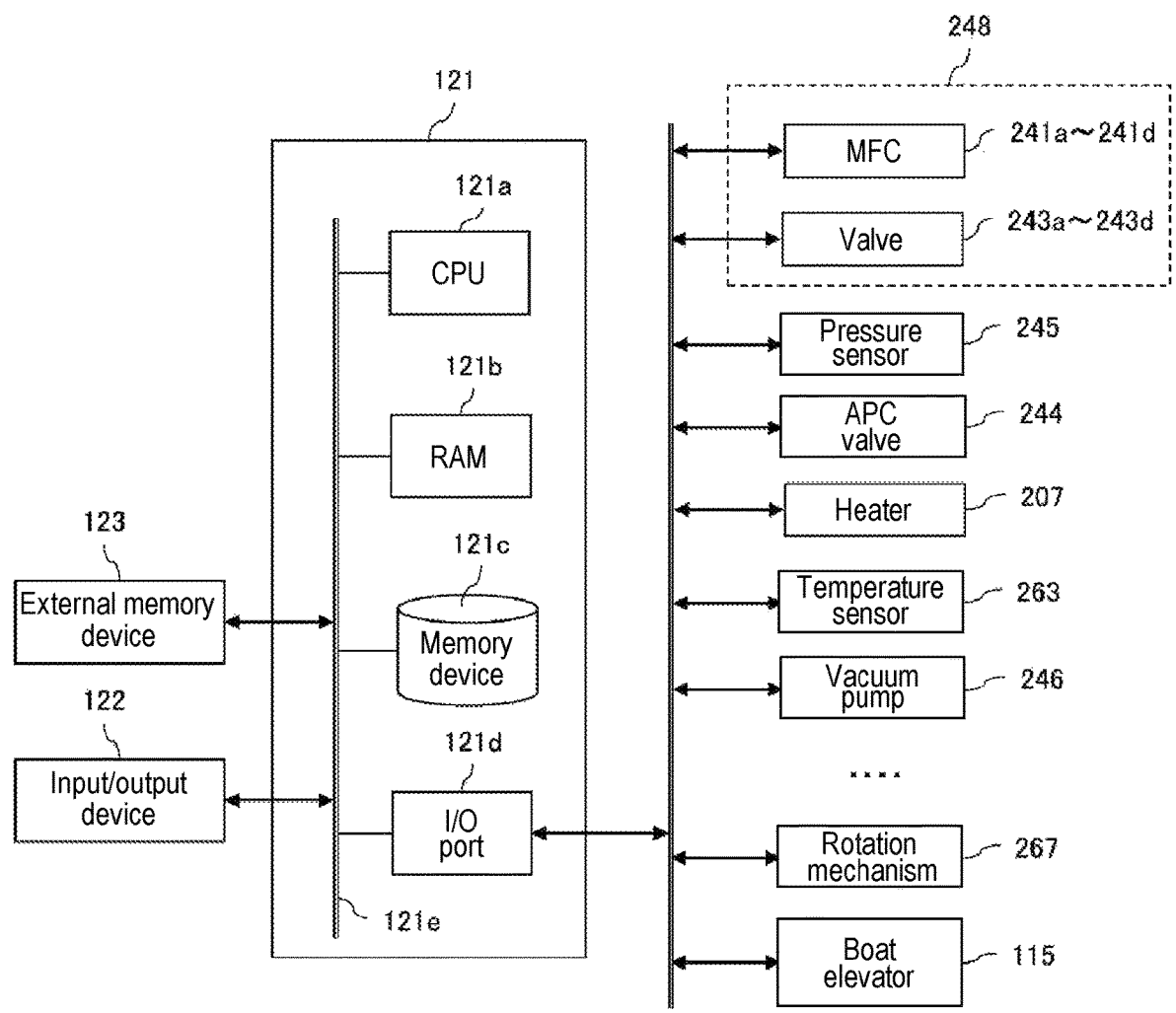
FIG. 3 is a schematic configuration diagram of a controller of the substrate processing apparatus suitably used in an embodiment of the present disclosure, in which a control system of the controller is shown in a block diagram.

As illustrated in FIG. 3, the controller 121, which is a control part (control means), may be configured as a computer including a central processing unit (CPU) 121a, a random access memory (RAM) 121b, a memory device 121c, and an I/O port 121d. The RAM 121b, the memory device 121c and the I/O port 121d are configured to exchange data with the CPU 121a via an internal bus 121e. An input/output device 122 including, e.g., a touch panel or the like, is connected to the controller 121.

The memory device 121c includes, for example, a flash memory, a hard disk drive (HDD), or the like. A control program for controlling operations of a substrate processing apparatus, a process recipe for specifying sequences and conditions of substrate processing as described hereinbelow, or the like is readably stored in the memory device 121c. The process recipe functions as a program for causing the controller 121 to execute each sequence in the substrate processing, as described hereinbelow, to obtain a predetermined result. Hereinafter, the process recipe and the control program will be generally and simply referred to as a "program." Furthermore, the process recipe will be simply referred to as a "recipe." When the term "program" is used herein, it may indicate a case of including only the recipe, a case of including only the control program, or a case of including both the recipe and the control program. The RAM 121b is configured as a memory area (work area) in which a program or data read by the CPU 121a is temporarily stored.

The I/O port 121d is connected to the MFCs 241a to 241d, the valves 243a to 243d, the pressure sensor 245, the APC valve 244, the vacuum pump 246, the temperature sensor 263, the heater 207, the rotation mechanism 267, the boat elevator 115, and the like, as mentioned above.

The CPU 121a is configured to read the control program from the memory device 121c and execute the same. The CPU 121a is also configured to read the recipe from the memory device 121c according to an input of an operation command from the input/output device 122. In addition, the CPU 121a is configured to control, according to the contents of the recipe thus read, the flow rate adjusting operation of various kinds of gases by the MFCs 241a to 241d, the opening/closing operation of the valves 243a to 243d, the opening/closing operation of the APC valve 244, the pressure regulating operation performed by the APC valve 244 based on the pressure sensor 245, the driving and stopping of the vacuum pump 246, the temperature adjusting operation performed by the heater 207 based on the temperature sensor 263, the operation of rotating the boat 217 with the rotation mechanism 267 and adjusting the rotation speed of the boat 217, the operation of moving the boat 217 up and down with the boat elevator 115, and the like.

The controller 121 may be configured by installing, on the computer, the aforementioned program stored in an external memory device 123 (for example, a magnetic disk such as an HDD, an optical disc such as a CD, a magneto-optical disc such as an MO, or a semiconductor memory such as a USB memory). The memory device 121c or the external memory device 123 is configured as a non-transitory computer-readable recording medium. Hereinafter, the memory device 121c and the external memory device 123 will be generally and simply referred to as a "recording medium." When the term "recording medium" is used herein, it may indicate a case of including only the memory device 121c, a case of including only the external memory device 123, or a case of including both the memory device 121c and the external memory device 123. Furthermore, the program may be supplied to the computer using a communication means such as the Internet or a dedicated line, instead of using the external memory device 123.

(2) Film Forming Process

A sequence example of forming a silicon oxycarbonitride film (SiOCN film) on a wafer 200 as a substrate using the aforementioned substrate processing apparatus, which is one of the processes for manufacturing a semiconductor device, will be described below with reference to FIG. 4A. Here, an example in which a patterned wafer having a pattern (concavo-convex structure) formed on the surface of the patterned wafer is used as the wafer 200 will be described. FIG. 5A is an enlarged cross sectional view illustrating only a portion of a concavo-convex structure of a wafer 200 with a pattern having an upper surface 200a, a side surface 200b, and a lower surface (bottom surface) 200c formed on the surface of the wafer 200. The patterned wafer has a larger surface area than a bare wafer having no pattern formed on the surface of the bare wafer. In the following descriptions, the operations of the respective parts constituting the substrate processing apparatus are controlled by the controller 121.

Figure 4A:
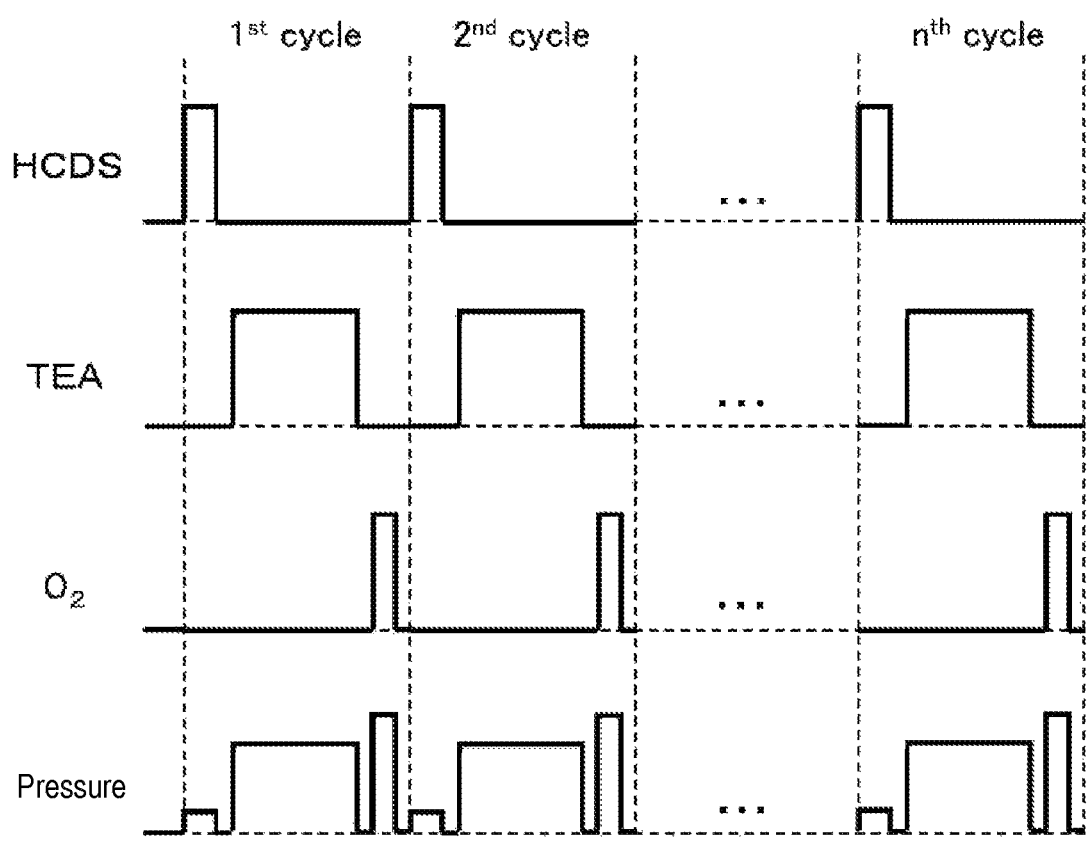
FIG. 4A is a diagram illustrating a film forming sequence according to one embodiment of the present disclosure and FIG. 4B is a diagram illustrating a modification example of the film forming sequence according to one embodiment of the present disclosure.
Figure 5A:
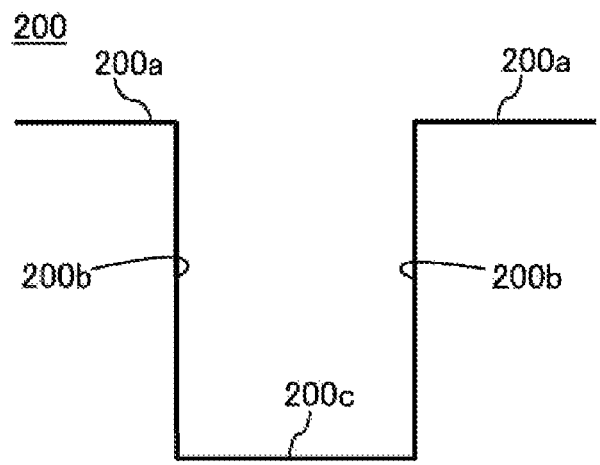
FIG. 5A is an enlarged cross sectional view of a substrate having a pattern formed on the surface of the substrate.

In the film forming sequence illustrated in FIG. 4A, an SiOCN film is formed on a pattern by performing a cycle a predetermined number of times, the cycle non-simultaneously performing a step A of supplying the HCDS gas (precursor) to a wafer 200 having a pattern formed on the surface of the wafer 200 to form a first layer containing Si, a step B of supplying the TEA gas (first reactant) to the wafer 200 so that a substance obtained by decomposing a portion of the TEA gas is adsorbed on the first layer in order to form a second layer containing Si, C and N, and a step C of supplying an $O_2$ gas (second reactant) to the wafer 200 to oxidize the second layer in order to form a third layer containing Si, O, C and N.

Furthermore, at step B, the TEA gas is supplied until the density of an adsorption layer of a substance obtained by decomposing a portion of the TEA gas formed on each of at least the upper surface 200a, the side surface 200b, and the lower surface 200c of the pattern is equalized (or substantially equalized).

In the present disclosure, for the sake of convenience, the sequence of the film forming process illustrated in FIG. 4A may sometimes be denoted as follows. The same denotation will be used in the modification examples and the like as described hereinbelow.

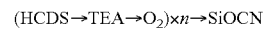

(HCDS→TEA→$O_2$)×n→SiOCN

When the term "wafer" is used herein, it may refer to "a wafer itself" or "a laminated body of a wafer and a predetermined layer or film formed on the surface of the wafer." In addition, when the phrase "a surface of a wafer" is used herein, it may refer to "a surface of a wafer itself" or "a surface of a predetermined layer or film formed on a wafer. Furthermore, in the present disclosure, the expression "a predetermined layer is formed on a wafer" may mean that "a predetermined layer is directly formed on a surface of a wafer itself" or that "a predetermined layer is formed on a layer formed on a wafer. In addition, when the term "substrate" is used herein, it may be synonymous with the term "wafer."

(Wafer Charging and Boat Loading)

A plurality of wafers 200 is charged on the boat 217 (wafer charging). Thereafter, as illustrated in FIG. 1, the boat 217 supporting the plurality of wafers 200 is lifted up by the boat elevator 115 and is loaded into the process chamber 201 (boat loading). In this state, the seal cap 219 seals the lower end of the reaction tube 203 via the O-ring 220.
(Pressure Regulation and Temperature Adjustment)

The interior of the process chamber 201, namely the space in which the wafers 200 are located, is vacuum-exhausted (depressurization-exhausted) by the vacuum pump 246 so as to reach a desired pressure (degree of vacuum). In this operation, the internal pressure of the process chamber 201 is measured by the pressure sensor 245. The APC valve 244 is feedback-controlled based on the measured pressure information. The wafers 200 in the process chamber 201 are heated by the heater 207 to a desired temperature. In this operation, the state of supplying electric power to the heater 207 is feedback-controlled based on the temperature information detected by the temperature sensor 263 such that the interior of the process chamber 201 has a desired temperature distribution. In addition, the rotation of the wafers 200 by the rotation mechanism 267 begins. The exhaust of the interior of the process chamber 201, and the heating and rotation of the wafers 200 may be continuously performed at least until the processing of the wafers 200 is completed.
(Film Forming Step)

Next, steps A to C are sequentially performed.

[Step A]

At this step, the HCDS gas is supplied to the wafer 200 within the process chamber 201.

Specifically, the valve 243a is opened to allow the HCDS gas to flow through the gas supply pipe 232a. The flow rate of the HCDS gas is adjusted by the MFC 241a. The HCDS gas is supplied into the process chamber 201 via the nozzle 249a and is exhausted from the exhaust pipe 231. At this time, the HCDS gas is supplied to the wafer 200. At this time, the valves 243c and 243d are opened to allow an $N_2$ gas to flow through the gas supply pipes 232c and 232d.

Examples of the processing conditions at this step may be described as follows:

HCDS gas supply flow rate: 1 to 2,000 sccm, specifically 10 to 1,000 sccm
HCDS gas supply time ($T_A$): 1 to 120 seconds, specifically 1 to 60 seconds
$N_2$ gas supply flow rate: 0 to 10,000 sccm
Processing temperature: 250 to 800 degrees C., specifically 400 to 750 degrees C., more specifically 550 to 700 degrees C.
Processing pressure: 1 to 2,666 Pa, specifically 67 to 1,333 Pa.

If the processing temperature is smaller than 250 degrees C., there may be a case where HCDS is difficult to be chemically adsorbed onto the wafer 200 and a practical film forming rate cannot be obtained. By setting the processing temperature to become 250 degrees C. or higher, it is possible to solve this. By setting the processing temperature to become 400 degrees C. or higher and further 550 degrees C. or higher, HCDS can be more sufficiently adsorbed onto the wafer 200 and a more sufficient film forming rate can be obtained.

If the processing temperature exceeds 800 degrees C., an excessive gas phase reaction may occur. Thus, the film thickness uniformity is likely to be deteriorates and the control of the film thickness uniformity is difficult. By setting the processing temperature at 800 degrees C. or lower, a moderate gas phase reaction can occur. Thus, it is possible to suppress the deterioration of the film thickness uniformity, and the control of the film thickness uniformity is possible. In particular, by setting the processing temperature at 750 degrees C. or lower and further 700 degrees C. or lower, the surface reaction becomes dominant over the gas phase reaction. Thus, it is easy to secure the film thickness uniformity and the control of the film thickness uniformity is facilitated.

By supplying the HCDS gas to the wafer 200 under the aforementioned conditions, an Si-containing layer containing Cl having a thickness of, for example, about less than one atomic layer (one molecular layer) to several atomic layers (several molecular layers) is formed as a first layer (initial layer) on the surface of the wafer 200, namely on each of the surface 200a, the side surface 200b, and the lower surface 200c of the pattern formed on the surface of the wafer 200. The first layer is formed on the surface of the wafer 200 by the physical adsorption of HCDS, the chemisorption of a substance obtained by decomposing a portion of HCDS, the thermal decomposition of HCDS, or the like. In the present disclosure the substance constituting the Si-containing layer containing Cl is also referred to as $Si_xCl_y$ (where $1 \leq x \leq 2$ and $0 \leq y \leq 6$) for the sake of convenience. Furthermore, the Si-containing layer containing Cl is also referred to simply as an Si-containing layer for the sake of convenience.

Figure 5B:
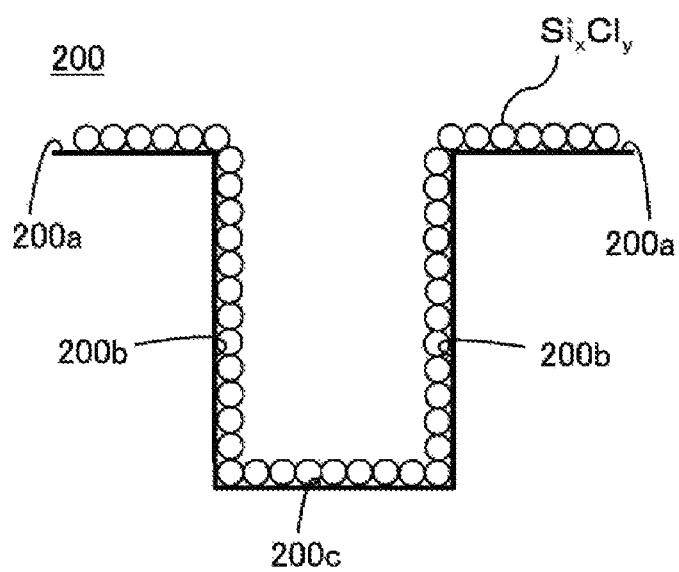
FIG. 5B is a schematic diagram illustrating a state after a precursor is supplied to a substrate having a pattern formed on the surface of the substrate.

The HCDS gas containing Cl is a gas which is active (easily decomposed) compared with the TEA gas composed of only N, C and H and which has a high adsorption efficiency onto the surface of the wafer 200. Therefore, by setting the supply time $T_A$ of the HCDS gas at a time which falls within the aforementioned range, namely without setting the HCDS gas supply time $T_A$ at a time as the same as $T_B$ described hereinbelow, it is possible to equalize the density of the first layer formed on each of the surface 200a, the side surface 200b, and the lower surface 200c of the pattern. FIG. 5B is a schematic diagram illustrating a state in which the first layer is continuously formed at a high density (equivalent density) on each of the surface 200a, the side surface 200b, and the lower surface 200c of the pattern by performing step A. In FIG. 5B, the symbol ○ indicates $Si_xCl_y$. This is the same in FIGS. 5C and 5D.

After the first layer is formed, the valve 243a is closed to stop the supply of the HCDS gas to the wafer 200. Then, the interior of the process chamber 201 is vacuum-exhausted and the gas or the like, which remains within the process chamber 201, is removed from the interior of the process chamber 201. At this time, the valves 243c and 243d are opened to supply $N_2$ gas into the process chamber 201. The $N_2$ gas acts as a purge gas. Thus, the interior of the process chamber 201 is purged.

As the precursor, it may be possible to use, in addition to the HCDS gas, for example, a chlorosilane-based gas such as monochlorosilane ($SiH_3Cl$, abbreviation: MCS) gas, dichlorosilane ($SiH_2Cl_2$, abbreviation: DCS) gas, trichlorosilane ($SiHCl_3$, abbreviation: TCS) gas, tetrachlorosilane ($SiCl_4$, abbreviation: STC) gas, octachlorotrisilane ($Si_3Cl_8$, abbreviation: OCTS) gas or the like. As the precursor gas, it may be possible to use tetrafluorosilane ($SiF_4$) gas, tetrabromosilane ($SiBr_4$) gas, tetraiodosilane ($SiI_4$) gas or the like. That is, as the precursor gas, it may be possible to use a halosilane-based gas other than a chlorosilane-based gas such as a fluorosilane-based gas, a bromosilane-based gas, an iodosilane-based gas or the like.

Furthermore, as the precursor, it may be possible to use an alkylenhalosilane-based gas such as 1,2-bis (trichlorosilyl) ethane (($SiCl_3)_2C_2H_4$, abbreviation: BTCSE) gas, bis (trichlorosilyl) methane (($SiCl_3)_2CH_2$, abbreviation: BTCSM) gas or the like, or an alkylhalosilane-based gas such as 1,1,2,2-tetrachloro-1,2-dimethyldisilane ($(CH_3)_2$ $Si_2Cl_4$, abbreviation: TCDMDS) gas, 1,2-dichloro-1,1,2,2-tetramethyldisilane (($CH_3)_4Si_2Cl_2$, abbreviation: DCTMDS) gas, 1-monochloro-1,1,2,2,2-pentamethyldisilane (($CH_3)_5Si_2Cl$, abbreviation MCPMDS) gas or the like. Since all of these gases contain Si—C bonds, it is possible to increase the C concentration in the SiOCN film finally formed.

In addition, as the precursor, it may be possible to use a silicon hydride gas such as monosilane ($SiH_4$, abbreviation: MS) gas, disilane ($Si_2H_6$, abbreviation: DS) gas, trisilane ($Si_3H_8$ abbreviation: TS) gas or the like.

Furthermore, as the precursor, it may be possible to suitably use an aminosilane-based gas such as tetrakis-dimethylaminosilane ($Si[N(CH_3)_2]_4$, abbreviation: 4DMAS) gas, tris-dimethylaminosilane ($Si[N(CH_3)_2]_3H$, abbreviation: 3DMAS) gas, bis-diethylaminosilane ($Si[N(C_2H_5)_2]_2H_2$, abbreviation: BDEAS) gas, bis-tert-butylaminosilane ($SiH_2[NH(C_4H_9)]_2$, abbreviation: BTBAS) gas, diisopropylaminosilane ($SiH_3N[CH(CH_3)_2]_2$, abbreviation: DIPAS) gas or the like. Since all of these gases contain Si—N bonds, it is possible to increase the N concentration in the SiOCN film finally formed.

As the inert gas, it may possible to use, in addition to the $N_2$ gas, for example, a rare gas such as Ar gas, He gas, Ne gas, Xe gas or the like. This is the same at steps B and C.

[Step B]

After step A is completed, the TEA gas is supplied to the wafer 200 within the process chamber 201, i.e., the first layer formed on the wafer 200.

At this step, the opening/closing control of the valves 243b to 243d is performed in the same procedure as the opening/closing control of the valves 243a, 243c and 243d at step A. The flow rate of the TEA gas is adjusted by the MFC 241b. The TEA gas is supplied into the process chamber 201 via the nozzle 249b and is exhausted from the exhaust pipe 231. At this time, the TEA gas is supplied to the wafer 200.

Examples of the processing conditions at this step may be described as follows:

TEA gas supply flow rate: 1 to 2,000 sccm, specifically 10 to 1,000 sccm

TEA gas supply time $T_B$: time longer than $T_A$ described above, specifically two times or more $T_A$, more specifically four times or more $T_A$, even more specifically 10 times or more $T_A$, much more specifically 15 times or more $T_A$ Processing pressure: 1 to 4,000 Pa, specifically 1 to 3,000 Pa.

Other processing conditions may be similar to the processing conditions at step A.

By supplying the TEA gas to the wafer 200 under the aforementioned conditions, the first layer formed on the wafer 200 at step A may react with the TEA gas. That is, Cl contained in the first layer may react with an ethyl group contained in the TEA gas. Thus, at least some of Cl contained in the first layer can be drawn out (separated) from the first layer and at least some of a plurality of ethyl groups contained in the TEA gas can be separated from the TEA gas. Furthermore, it becomes possible to combine N of the TEA gas, from which at least some of the ethyl groups have been separated, and Si contained in the first layer to form Si—N bonds. At this time, it also becomes possible to combine C contained in the ethyl groups ($—CH_2CH_3$) separated from the TEA gas and Si contained in the first layer to form Si—C bonds. As a result, Cl is desorbed from the first layer, and an adsorption layer of a substance obtained by decomposing a portion of TEA is formed on the first layer. In the present disclosure, the substance obtained by decomposing a portion of TEA is also referred to as $N(C_xH_y)_z$ (where $0 \le x \le 2$, $0 \le y \le 5$, and $0 \le z \le 3$) for the sake of convenience. A layer including the first layer and the adsorption layer of $N(C_xH_y)_z$ formed on the first layer, i.e., a silicon carbonitride layer (SiCN layer) which is a layer containing Si, C and N is formed as a second layer on the wafer 200.

Figure 5C:
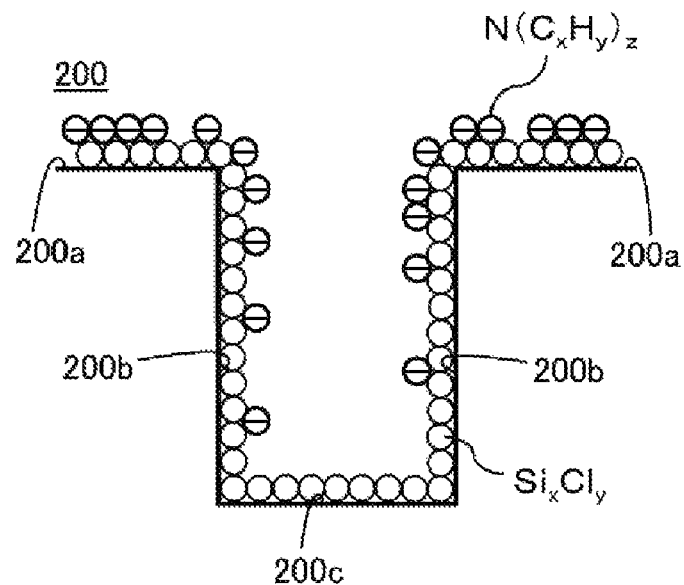
FIGS. 5C and 5D are schematic diagrams illustrating states after a precursor and a reactant are sequentially supplied to a substrate having a pattern formed on the surface of the substrate, respectively.

Compared with the HCDS gas containing Cl, the TEA gas is a gas which has a low degree of activity (difficult to be decomposed) and which has a low adsorption efficiency onto the surface of the wafer 200. Therefore, if the supply time $T_B$ of the TEA gas is set to be shorter than or equal to the supply time $T_A$ of the HCDS gas ($T_B \le T_A$), the density of the adsorption layer of $N(C_xH_y)_z$ formed on each of the surface 200a, the side surface 200b and the lower surface 200c of the pattern may differ. FIG. 5C is a schematic diagram illustrating a density of the adsorption layer of $N(C_xH_y)_z$ formed on the surface of the wafer 200 (on the surface of the first layer) when set to be $T_B \le T_A$. In FIG. 5C, the symbol Θ indicates $N(C_xH_y)_z$. This is the same in FIG. 5D.

As illustrated in FIG. 5C, when set to be $T_B \le T_A$, the adsorption layer of $N(C_xH_y)_z$ may be formed at a somewhat high density on the surface 200a of the pattern. However, the adsorption amount of $N(C_xH_y)_z$ significantly decreases on the side surface 200b of the pattern and the adsorption layer of $N(C_xH_y)$, may be a discontinuous layer. Furthermore, $N(C_xH_y)_z$ hardly adsorbs onto the lower surface 200c of the pattern and no adsorption layer of $N(C_xH_y)$, may be formed. When the density of the adsorption layer of $N(C_xH_y)_z$ becomes unequal as illustrated in FIG. 5C, the thickness of the SiOCN film finally formed may significantly differ on each of the surface 200a, the side surface 200b, and the lower surface 200c of the pattern. As a result, a phenomenon that the film thickness (average film thickness) of the SiOCN film formed on the wafer 200 is smaller than the film thickness (average film thickness) of the SiOCN film formed on the bare wafer by the same processing procedures and processing conditions as in this case, i.e., a film thickness drop phenomenon, is likely to occur. Furthermore, when the density of the adsorption layer of $N(C_xH_y)$, becomes unequal as illustrated in FIG. 5C, at least one of the N concentration and the C concentration in the adsorption layer of $N(C_xH_y)_z$ formed on each of the surface 200a, the side surface 200b and the lower surface 200c of the pattern may differ. As a result, the composition of the SiOCN film finally formed may significantly differ on each of the surface 200a, the side surface 200b and the lower surface 200c of the pattern.

Figure 5D:
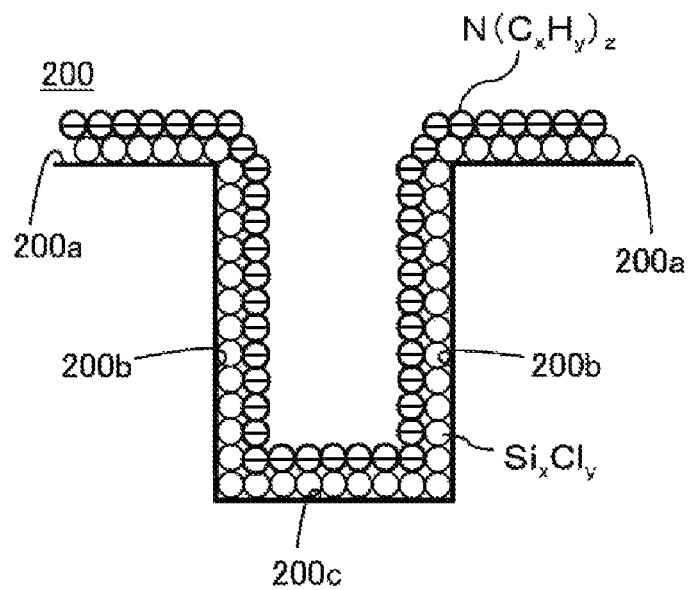

On the other hand, as in this embodiment, by setting the supply time $T_B$ of the TEA gas to become longer than the supply time $T_A$ of the HCDS gas ($T_B > T_A$), it is possible to equalize the density of the adsorption layer of $N(C_xH_y)_z$ formed on each of the surface 200a, the side surface 200b, and the lower surface 200c of the pattern. FIG. 5D is a schematic diagram illustrating a state in which the adsorption layer of $N(C_xH_y)_z$ is continuously formed at a high density (equivalent density) on each of the surface 200a, the side surface 200b and the lower surface 200c of the pattern by setting $T_B > T_A$. By arranging the density distribution of the adsorption layer of $N(C_xH_y)_z$ in the plane as in FIG. 5D, it is possible to equalize the thickness of the SiOCN film finally formed on each of the surface 200a, the side surface 200b and the lower surface 200c of the pattern. As a result, according to this embodiment, even when a patterned wafer is used as the wafer 200, it is possible to avoid a decrease of the film thickness (average film thickness) of the SiOCN film, i.e., to suppress the occurrence of the film thickness drop phenomenon. In addition, by arranging the density distribution of the adsorption layer of $N(C_xH_y)_z$ in the plane as in FIG. 5D, it is possible to equalize at least one of the N concentration and the C concentration in the adsorption layer of $N(C_xH_y)_z$ formed on each of the surface 200a, the side surface 200b and the lower surface 200c of the pattern. As a result, it is also possible to equalize the composition of the SiOCN film finally formed on each of the surface 200a, the side surface 200b and the lower surface 200c of the pattern. Furthermore, the aforementioned effects may be sufficiently achieved by setting $T_B$ at a time greater than or equal to twice $T_A$ ($T_B \geq 2T_A$), and the aforementioned effects may be more sufficiently achieved by setting $T_B$ at a time greater than or equal to four times $T_A$ ($T_B \geq 4T_A$). In addition, the aforementioned effects may be reliably achieved by setting $T_B$ at a time of more than 10 times $T_A$ ($T_B \geq 10T_A$), and the aforementioned effects may be more reliably achieved by setting $T_B$ at a time greater than or equal to 15 times $T_A$ ($T_B \geq 15T_A$). For example, when $T_A$ is set at a time which falls within a range of 10 to 13 seconds, the aforementioned effects may be reliably achieved by setting $T_B$ at 100 to 130 seconds, and the aforementioned effects may be more reliably achieved by setting $T_B$ at 150 to 195 seconds. However, it is desirable to set $T_B$ at a time less than or equal to 20 times $T_A$ ($T_B \leq 20T_A$) in consideration of productivity.

Furthermore, in order to achieve the aforementioned effects, it is effective not only to lengthen the supply time $T_B$ of the TEA gas but also to increase the supply flow rate of the TEA gas. However, the TEA gas is a gas obtained by vaporizing a liquid precursor staying in a liquid state under a room temperature and an atmospheric pressure, and in many cases, it is difficult to make the flow rate thereof large. Therefore, when the gas obtained by vaporizing the liquid precursor such as the TEA gas is used as the first reactant, a method of adjusting the supply time $T_B$ of the TEA gas, i.e., a method of setting $T_B > T_A$, specifically $T_B \geq 2T_A$, more specifically $T_B \geq 4T_A$, more specifically $T_B \geq 10T_A$, even more specifically $T_B \geq 15T_A$, as in this embodiment, is particularly effective.

After the second layer is formed, the valve 243b is closed to stop the supply of the TEA gas to the wafer 200. Then, the gas or the like, which remains within the process chamber 201, is removed from the interior of the process chamber 201 by the same processing procedure as that of step A.

As the amine-based gas as the first reactant, it may be possible to use, in addition to the TEA gas, an ethylamine-based gas such as diethylamine $((C_2H_5)_2N)H$, abbreviation: DEA) gas, monoethylamine $(C_2H_5NH_2$, abbreviation: MEA) gas or the like, a methylamine-based gas such as trimethylamine $(CH_3)_3N$, abbreviation: TMA) gas, dimethylamine $((CH_3)_2NH$, abbreviation: DMA) gas, monomethylamine $(CH_3NH_2$, abbreviation: MMA) gas or the like, a propylamine-based gas such as tripropylamine $((C_3H_7)_3N$, abbreviation: TPA) gas, dipropylamine $((C_3H_7)_2NH$, abbreviation: DPA) gas, monopropylamine $(C_3H_7NH_2$, abbreviation: MPA) gas or the like, an isopropylamine-based gas such as triisopropylamine $([(CH_3)_2CH]_3N$, abbreviation: TIPA) gas, diisopropylamine $((CH_3)_2CH]_2NH$, abbreviation: DIPA) gas, monoisopropylamine $((CH_3)_2CHNH_2$, abbreviation: MIPA) gas or the like, a butylamine-based gas such as tributylamine $((C_4H_9)_3N$, abbreviation: TBA) gas, dibutylamine $((C_4H_9)_2NH$, abbreviation: DBA) gas, monobutylamine $(C_4H_9NH_2$, abbreviation: MBA) gas or the like, or an isobutylamine-based gas such as triisobutylamine $[(CH_3)_2CHCH_2]_3N$, abbreviation: TIBA) gas, diisobutylamine $([(CH_3)_2CHCH_2]_2NH$, abbreviation: DIBA) gas, monoisobutyl amine $((CH_3)_2CHCH_2NH_2$, abbreviation: MIBA) gas or the like.

In addition, as the first reactant, it may be possible to use, in addition to the amine-based gas, an organic hydrazine gas. As the organic hydrazine gas, it may be possible to use a methylhydrazine-based gas such as monomethylhydrazine $((CH_3)HN_2H_2$, abbreviation: MMH) gas, dimethylhydrazine $((CH_3)_2N_2H_2$, abbreviation: DMH) gas, trimethylhydrazine $((CH_3)_2N_2(CH_3)H$, abbreviation: TMH) gas or the like, or an ethylhydrazine-based gas such as ethylhydrazine $((C_2H_5)HN_2H_2$, abbreviation: EH) gas.

[Step C]

After step B is completed, an $O_2$ gas is supplied to the wafer 200 within the process chamber 201, i.e., the second layer formed on the wafer 200.

At this step, the opening/closing control of the valves 243b to 243d is performed in the same procedure as the opening/closing control of the valves 243a, 243c and 243d at step A. The flow rate of the $O_2$ gas is adjusted by the MFC 241b. The $O_2$ gas is supplied to the process chamber 201 via the nozzle 249b and is exhausted from the exhaust pipe 231. At this time, the $O_2$ gas is supplied to the wafer 200.

Examples of the processing conditions at this step may be described as follows:

$O_2$ gas supply flow rate: 100 to 10,000 sccm
$O_2$ gas supply time $T_C$: 1 to 120 seconds, specifically 1 to 60 seconds
Processing pressure: 1 to 4,000 Pa, specifically 1 to 3,000 Pa.

Other processing conditions may be similar to the processing conditions of step A.

By supplying the $O_2$ gas to the wafer 200 under the aforementioned conditions, it is possible to modify (oxidize) at least a portion of the second layer formed on the wafer 200 by performing step B. That is, at least a portion of the O component contained in the $O_2$ gas can be added to the second layer to form Si—O bonds in the second layer. By modifying the second layer, a silicon oxycarbonitride layer (SiOCN layer) which is a layer containing Si, O, C and N is formed as a third layer on the wafer 200. When forming the third layer, at least a portion of the C component and the N component contained in the second layer is maintained in the second layer without being desorbed from the second layer. When forming the third layer, Cl contained in the second layer constitutes a gaseous substance containing at least Cl in the process of modification reaction with the $O_2$ gas and is discharged from the interior of the process chamber 201. That is, an impurity such as Cl in the second layer is pulled out or desorbed from the interior of the second layer so as to be separated from the second layer. Thus, the third layer becomes a layer having less impurity such as Cl than the second layer.

After the third layer is formed, the valve 243b is closed to stop the supply of the $O_2$ gas to the wafer 200. Then, the gas or the like, which remains within the process chamber 201, is removed from the interior of the process chamber 201 by the same processing procedure as that of step A.

As the oxidizing gas as the second reactant, it may be possible to use, in addition to the $O_2$ gas, an O-containing gas such as water vapor ($H_2O$ gas), nitrogen monoxide (NO) gas, nitrous oxide ($N_2O$) gas, nitrogen dioxide ($NO_2$) gas, carbon monoxide (CO) gas, carbon dioxide ($CO_2$) gas, ozone ($O_3$) gas, hydrogen ($H_2$) gas+$O_2$ gas, $H_2$ gas+$O_3$ gas or the like.

[Performing a Predetermined Number of Times]

A cycle which includes non-simultaneously, i.e., non-synchronously, performing steps A to C is implemented once or more (n times). Thus, an SiOCN film having a desired composition and a desired film thickness can be formed on the wafer 200. The aforementioned cycle may be repeated multiple times. That is, the thickness of the third layer formed per one cycle may be set to be smaller than a desired film thickness and the aforementioned cycle may be repeated multiple times until the thickness of the SiOCN film formed by laminating the third layer becomes equal to the desired film thickness.

(After Purge Step and Atmospheric Pressure Return)

After the SiOCN film having a desired composition and a desired film thickness is formed on the wafer 200, the $N_2$ gas is supplied from each of the nozzles 249a and 249b into the process chamber 201 and is exhausted from the exhaust pipe 231. Thus, the interior of the process chamber 201 is purged and the gas or the reaction byproduct, which remains within the process chamber 201, is removed from the interior of the process chamber 201 (after purge). Thereafter, the internal atmosphere of the process chamber 201 is substituted by an inert gas (inert gas substitution). The internal pressure of the process chamber 201 is returned to an atmospheric pressure (atmospheric pressure return).

(Boat Unloading and Wafer Discharging)

The seal cap 219 is moved down by the boat elevator 115 to open the lower end of the reaction tube 203. The processed wafers 200 supported on the boat 217 are unloaded from the lower end of the reaction tube 203 to the outside of the reaction tube 203 (boat unloading). The processed wafers 200 are unloaded to the outside of the reaction tube 203 and are subsequently discharged from the boat 217 (wafer discharging).

(3) Effects According to the Present Embodiment

According to the present embodiment, one or more effects as set forth below may be achieved.

(a) By setting $T_B>T_A$ at step B, it becomes possible to equalize the density of the adsorption layer of $N(C_xH_y)_z$ formed on each of the surface 200a, the side surface 200b, and the lower surface 200c of the pattern. This makes it possible to equalize the thickness of the SiOCN film finally formed on each of the surface 200a, the side surface 200b, and the lower surface 200c of the pattern. As a result, it becomes possible to suppress the occurrence of the film thickness drop phenomenon.

(b) By setting $T_B>T_A$ at step B, it becomes possible to equalize at least one of the N concentration and the C concentration in the adsorption layer of $N(C_xH_y)_z$ formed on each of the surface 200a, the side surface 200b, and the lower surface 200c of the pattern. This makes it possible to equalize the composition of the SiOCN film finally formed on each of the surface 200a, the side surface 200b and the lower surface 200c of the pattern.

(c) By setting $T_B>T_A$ or $T_B>T_C$ at step B, it becomes possible to increase the thickness of the SiOCN layer formed per one cycle, i.e., to increase the cycle rate.

(d) By setting $T_B>T_A$ or $T_B>T_C$ at step B, it becomes possible to finely adjust the composition in the SiOCN film finally formed. Specifically, it becomes possible to control the composition of the SiOCN film in a direction to increase the C concentration in the SiOCN film and in a direction to reduce the N concentration in the SiOCN film, respectively, as $T_B$ is lengthened.

(e) Since only $T_B$, not $T_A$, is lengthened, it becomes possible to suppress the occurrence of the film thickness drop phenomenon while avoiding the deterioration of the wafer in-plane film thickness uniformity and the step coverage of the SiOCN film finally formed. On the other hand, if not only $T_B$ but also $T_A$ is set to be as long as $T_B$, even though the occurrence of the film thickness drop phenomenon could be suppressed, the decomposition of HCDS on the wafer 200 becomes excessive. The wafer in-plane film thickness uniformity and the step coverage of the SiOCN film finally formed are likely to be deteriorated, respectively.

(f) The effects mentioned above can be similarly achieved in the case where the aforementioned precursor other than the HCDS gas is used, in the case where the aforementioned first reactant other than the TEA gas is used, in the case where the aforementioned second reactant other than the $O_2$ gas is used, or in the case where the aforementioned inert gas other than the $N_2$ gas is used.

(4) Modification Examples

The present embodiment may be modified as in the modification examples described below. These modification examples may be arbitrarily combined.

Modification Example 1

In the film forming sequence described above, the method of setting $T_B>T_A$ has been mainly described. However, even in the case of setting $T_B>T_C$, the same effects as those of the film forming sequence illustrated in FIG. 4A may be achieved. Furthermore, the aforementioned effects may be sufficiently achieved by setting $T_B$ at a time greater than or equal to 1.5 times $T_C$ ($T_B \geq 1.5T_C$), and the aforementioned effects may be more sufficiently achieved by setting $T_B$ at a time greater than or equal to 3 times $T_C$ ($T_B \geq 3T_C$). In addition, the aforementioned effects may be reliably achieved by setting $T_B$ at a time greater than or equal to five times $T_C$ ($T_B \geq 5T_C$), and the aforementioned effects may be more reliably achieved by setting $T_B$ at a time greater than or equal to 10 times $T_C$ ($T_B \geq 10T_C$). However, it is desirable to set $T_B$ at a time less than or equal to 20 times $T_C$ ($T_B \leq 20T_C$) in consideration of productivity. Other processing procedures and processing conditions may be similar to the processing sequences and processing conditions of the film forming sequence described above.

Modification Example 2

As in the film forming sequence illustrated in FIG. 4B or set forth below, the TEA gas may be dividedly (in pulses or intermittently) supplied at step B per cycle. That is, at step B per cycle, the supply of the TEA gas to the wafer 200 and the purge operation of the interior of the process chamber 201 may be alternately repeated a plurality of times (m times).

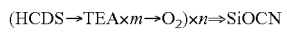

(HCDS→TEA×m→$O_2$)×n⇒SiOCN

Even in this modification example, at step B, the TEA gas may be continuously and dividedly supplied until the density of the adsorption layers of $N(C_xH_y)_z$ formed on each of at least the upper surface 200a, the side surface 200b, and the lower surface 200c of the pattern is equalized. For example, it becomes possible to realize this by setting the total supply time (the total supply time of each pulse) of the TEA gas at step B per cycle to become longer than the supply time $T_A$ of the HCDS gas at step A per cycle or to become longer than the supply time $T_C$ of the $O_2$ gas at step C per cycle.

Furthermore, in this modification example, it is desirable to dividedly supply the TEA gas in multiple times by setting the supply time of the TEA gas per pulse at step B in one cycle shorter than the supply time $T_A$ of the HCDS gas at step A per cycle. It is also desirable to dividedly supply the TEA gas in multiple times by setting the supply time of the TEA gas per pulse at step B in one cycle shorter than the supply time of the $O_2$ gas at step C per cycle. Other processing procedures and processing conditions may be similar to the processing procedures and processing conditions of the film forming sequence illustrated in FIG. 4A.

Even in this modification example, the same effects as those of the film forming sequence illustrated in FIG. 4A may be achieved.

Furthermore, according to this modification example, the adsorption efficiency onto the surface of the wafer 200 of $N(C_xH_y)_z$ can be increased by dividedly supplying the TEA gas at step B. This is because a portion of the TEA gases supplied to the wafer 200 stays on the surface of the first layer without causing a reaction with the first layer and thus hampers the formation of the adsorption layer of $N(C_xH_y)_z$ onto the first layer. This is also because the reaction byproduct generated in forming the adsorption layer of $N(C_xH_y)_z$ stays on the surface of the first layer and thus hampers the formation of the adsorption layer of $N(C_xH_y)_z$ onto the first layer. On the other hand, as in this modification example, by alternately supplying the TEA gas to the wafer 200 and the purge operation of the interior of the process chamber 201a a plurality of times at step B, it becomes possible to quickly remove the factor of hampering the formation of the adsorption layer of $N(C_xH_y)_z$ onto the first layer (the TEA gas or the reaction byproduct which failed in the adsorption reaction) from the surface of the first layer. As a result, it becomes possible to increase the adsorption efficiency of $N(C_xH_y)_z$ onto the surface of the wafer 200, and to further suppress the occurrence of the film thickness drop phenomenon in the SiOCN film finally formed. It also becomes possible to further increase the thickness of the SiOCN layer formed per cycle, i.e., to further increase the cycle rate.

Modification Example 3

The silicon carbonitride film (SiCN film) containing Si, C, and N may be formed on the wafer 200 without performing step C as in the film forming sequences denoted below. The processing procedures and processing conditions of steps A and B in this modification example may be similar to those of steps A and B of the film forming sequence illustrated in FIG. 4A.

(HCDS→TEA)×n⇒SiCN

(HCDS→TEA××m)×n⇒SiCN

Even in this modification example, the same effects as those of the film forming sequence illustrated in FIG. 4A may be achieved.

OTHER EMBODIMENTS

While the embodiment of the present disclosure has been specifically described above, the present disclosure is not limited to the aforementioned embodiment but may be differently modified without departing from the spirit of the present disclosure.

For example, the present disclosure may be suitably applied to a case where a metal thin film such as titanium oxycarbonitride film (TiOCN film) or titanium carbonitride film (TiCN film) is formed. These films may be formed by the film forming sequences denoted below using, for example, a precursor such as titanium tetrachloride ($TiCl_4$) gas or the like, or a reactant such as the amine-based gas described above, an oxidizing gas or the like. Even in the case of performing these film forming sequences, a film may be formed under the same processing procedures and processing conditions as those of the aforementioned embodiment, and the same effects as those of the aforementioned embodiment may be achieved.

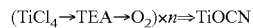
($TiCl_4$→TEA→$O_2$)×n⇒TiOCN

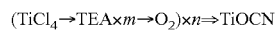
($TiCl_4$→TEA×m→$O_2$)×n⇒TiOCN

($TiCl_4$→TEA)×n⇒TiCN

($TiCl_4$→TEA×m)×n⇒TiCN

Recipes used in substrate processing may be prepared individually according to the processing contents and may be stored in the memory device 121c via a telecommunication line or the external memory device 123. Moreover, at the start of substrate processing, the CPU 121a may properly select an appropriate recipe from the recipes stored in the memory device 121c according to the contents of the substrate processing. Thus, it is possible for a single substrate processing apparatus to form films of different kinds, composition ratios, qualities and thicknesses with the enhanced reproducibility. In addition, it is possible to reduce an operator's burden and to quickly start the substrate processing while avoiding an operation error.

The recipes mentioned above are not limited to newly-prepared ones but may be prepared by, for example, modifying the existing recipes already installed in the substrate processing apparatus. When modifying the recipes, the modified recipes may be installed in the substrate processing apparatus via a telecommunication line or a recording medium storing the recipes. In addition, the existing recipes already installed in the substrate processing apparatus may be directly modified by operating the input/output device 122 of the existing substrate processing apparatus.

In the aforementioned embodiment, there has been described an example in which films are formed using a batch-type substrate processing apparatus capable of processing a plurality of substrates at a time. The present disclosure is not limited to the aforementioned embodiment but may be appropriately applied to, e.g., a case where films are formed using a single-wafer-type substrate processing apparatus capable of processing a single substrate or several substrates at a time. In addition, in the aforementioned embodiment, there has been described an example in which films are formed using a substrate processing apparatus provided with a hot-wall-type processing furnace. The present disclosure is not limited to the aforementioned embodiment but may be appropriately applied to a case where films are formed using a substrate processing apparatus provided with a cold-wall-type processing furnace.

In the case of using these substrate processing apparatuses, a film forming process may be performed by the sequence and processing conditions similar to those of the embodiment and modification examples described above. Effects similar to those of the embodiment and modification examples described above may be achieved.

The embodiment and modification examples described above may be appropriately combined with one another. In addition, the processing procedures and processing conditions used at this time may be similar to, for example, the processing procedures and processing conditions of the film forming sequence of the embodiment described above.

Various films formed by the embodiment and modification examples described above may be widely used as an insulating film, a spacer film, a mask film, a charge storage film, a stress control film, and the like. It has been required that the more accurate film thickness control be realized for films formed on a wafer according to the recent miniaturization of semiconductor devices. The present disclosure capable of accurately controlling the thickness of a film formed on a patterned wafer having a high density pattern formed on the surface of the patterned wafer is extremely useful as a technique for responding to such requirement.

EMBODIMENT EXAMPLES

Next, embodiment examples will be described.

In embodiment example 1, a process of forming an SiOCN film on a plurality of wafers was performed twice using the substrate processing apparatus illustrated in FIG. 1 by the film forming sequence illustrated in FIG. 4A. In the first film forming process, all of 100 wafers charged on the boat were defined as bare wafers. In the second film forming process, 25 wafers on the upper side among the wafers charged on the boat were defined as patterned wafers having a surface area 10 times larger than that of the bare wafers, and the other 75 wafers were defined as the bare wafers. In either of the film forming processes, the supply time $T_B$ of the TEA gas at step B per cycle was set to be about 2 to 4 times the supply time $T_A$ of the HCDS gas at step A per cycle and was set to be about 1 to 5 times the supply time $T_C$ of the $O_2$ gas per cycle. Other processing conditions were set at predetermined conditions which fall within the range of the processing conditions described in the aforementioned embodiment.

In embodiment example 2, a process of forming an SiOCN film on a plurality of wafers was performed twice using the substrate processing apparatus illustrated in FIG. 1 by the film forming sequence illustrated in FIG. 4A. In the first film forming process, all of 100 wafers charged on the boat were defined as bare wafers. In the second film forming process, 25 wafers on the upper side among the wafers charged on the boat were defined as patterned wafers having a surface area 10 times larger than that of the bare wafers, and the other 75 wafers were defined as the bare wafers. In either of the film forming processes, the supply time $T_B$ of the TEA gas at step B per cycle was set to be about 10 to 15 times the supply time $T_A$ of the HCDS gas at step A per cycle and was set to be about 10 to 20 times the supply time $T_C$ of the $O_2$ gas per cycle. Other processing conditions were set to be equal to the processing conditions of embodiment example 1.

Figure 4B:
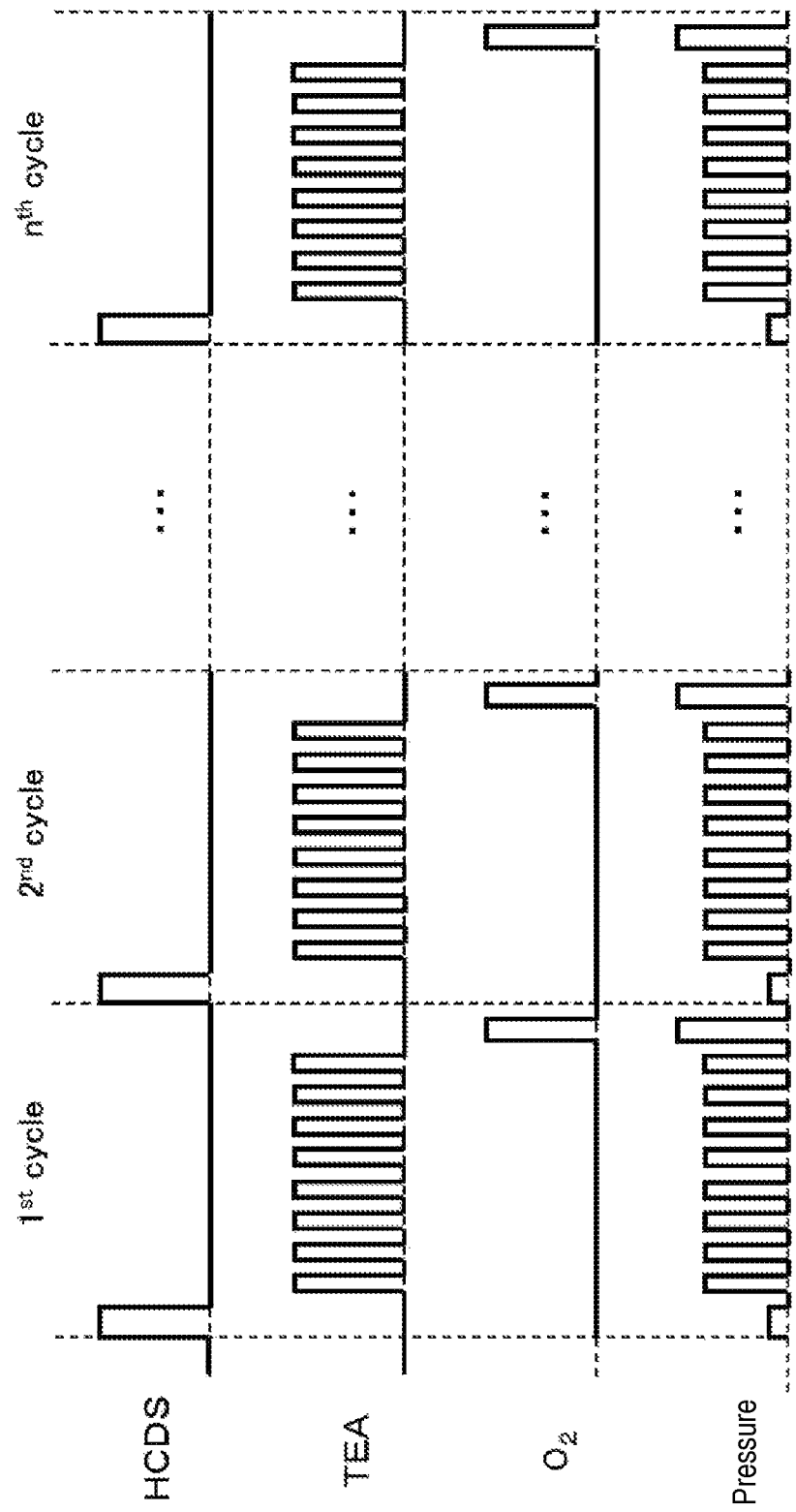

In embodiment example 3, a process of forming an SiOCN film on a plurality of wafers was performed twice using the substrate processing apparatus illustrated in FIG. 1 by the film forming sequence illustrated in FIG. 4B. In the first film forming process, all of 100 wafers charged on the boat were defined as bare wafers. In the second film forming process, 25 wafers on the upper side among the wafers charged on the boat were defined as patterned wafers having a surface area 10 times larger than that of the bare wafers, and the other 75 wafers were defined as the bare wafers. In either of the film forming processes, the total supply time (the total supply time of each pulse) of the TEA gas at step B per cycle was set to be equal to the supply time $T_B$ of the TEA gas at step B per cycle in embodiment example 1. Other processing conditions were set to be equal to the processing conditions of embodiment example 1.

In a comparative example, a process of forming an SiOCN film on a plurality of wafers, was performed twice using a substrate processing apparatus illustrated in FIG. 1 by a film forming sequence in which a cycle of non-simultaneously performing supplying an HCDS gas to a wafer, supplying a TEA gas to the wafer, and supplying an $O_2$ gas to the wafer is implemented a plurality of times. In the first film forming process, all of 100 wafers charged on the boat were defined as bare wafers. In the second film forming process, 25 wafers on the upper side among the wafers charged on in the boat were defined as patterned wafers having a surface area 10 times larger than that of the bare wafers, and the other 75 wafers were defined as the bare wafers. In either of the film forming processes, the supply time of TEA gas per cycle was set to be equal to the supply time of HCDS gas per cycle. Other processing conditions were set to be equal to the processing conditions of embodiment example 1.

Figure 6A:
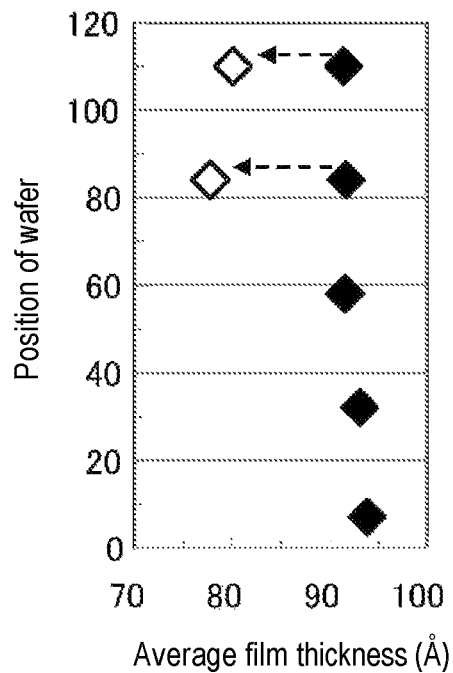
FIGS. 6A to 6C are diagrams illustrating results of evaluating a thickness of a film formed on a substrate, respectively.
Figure 6B:
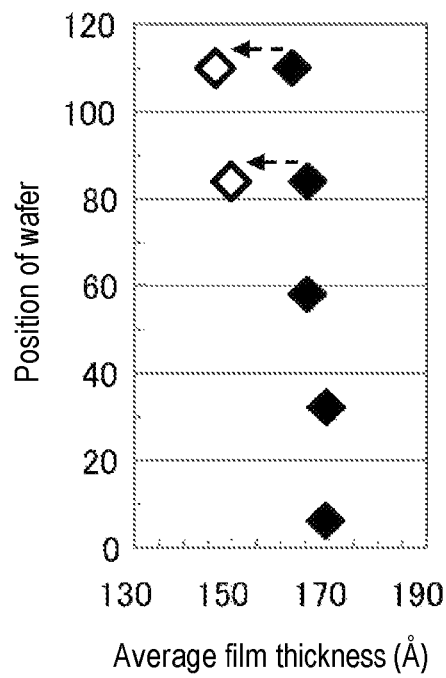
Figure 6C:
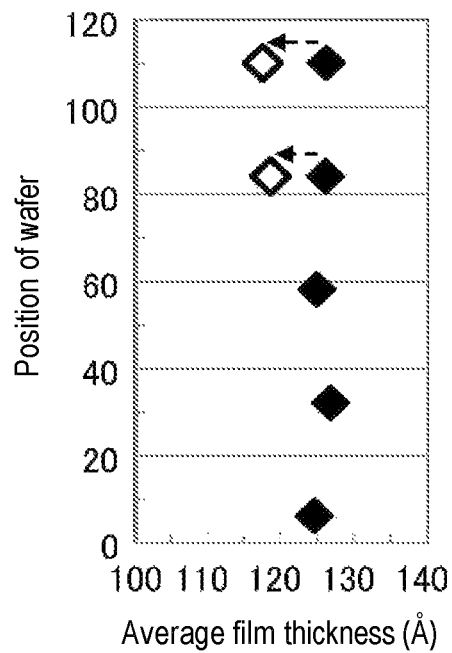

Furthermore, in each of embodiment examples 1 to 3 and the comparative example, each of the average in-plane film thickness $(AV_1)$ of the SiOCN film formed on the bare wafers in the first film forming process and the average in-plane film thickness $(AV_2)$ of the SiOCN film formed on the patterned wafers in the second film forming process was measured, and the degree of occurrence of the film thickness drop phenomenon was evaluated. FIGS. 6A to 6C are diagrams illustrating results of measuring the thicknesses of the SiOCN film in the comparative example, embodiment example 1, and embodiment example 3, respectively. The horizontal axis in each drawing shows an average in-plane film thickness (Å), and the vertical axis shows a position of the wafer charged on the boat (where 120 is at the TOP side and 0 is at the BOTTOM side). In the drawing, the symbol ♦ represents an average in-plane film thickness $(AV_1)$ of the SiOCN film formed on the bare wafer in the first film forming process, and the symbol ◇ represents an average in-plane film thickness $(AV_2)$ of the SiOCN film formed on the patterned wafer in the second film forming process.

As illustrated in FIG. 6A, in the comparative example, it was found that there occurs the film thickness drop phenomenon that the average in-plane film thickness $(AV_2)$ of the SiOCN film formed on the patterned wafer was smaller than the average in-plane film thickness $(AV_1)$ of the SiOCN film formed on the bare wafer, and the film thickness drop rate represented by $[(AV_1-AV_2)/AV_1] \times 100$ reaches 14.9%.

Furthermore, as illustrated in FIG. 6B, it was found that the film thickness drop rate in embodiment example 1 was smaller than that in the comparative example which is about 9.2%. That is, it was found that the occurrence of the film thickness drop phenomenon can be suppressed by setting the supply time $T_B$ of the TEA gas at step B per cycle larger than the supply time $T_A$ of the HCDS gas at step A per cycle and larger than the supply time $T_C$ of the $O_2$ gas at step C per cycle.

Although not illustrated, it was recognized that the film thickness drop rate in embodiment example 2 was smaller than those in the comparative example and embodiment example 1 which is about 6.0%. That is, it was recognized that the occurrence of the film thickness drop phenomenon can be drastically suppressed by setting the supply time $T_B$ of the TEA gas at step B per cycle to about 10 to 15 times the supply time $T_A$ of the HCDS gas at step A per cycle and to about 10 to 20 times the supply time $T_C$ of the $O_2$ gas at step C per cycle.

Furthermore, as illustrated in FIG. 6C, it was found that the film thickness drop rate in embodiment example 3 was smaller than those in the comparative example and embodiment example 1 which is about 6.0%. That is, it was found that the occurrence of the film thickness drop phenomenon can be drastically suppressed by dividedly supplying the TEA gas and by setting the total supply time of the TEA gas at step B per cycle to become larger than the supply time $T_A$ of the HCDS gas at step A per cycle.

According to the present disclosure in some embodiments, it is possible to suppress the occurrence of a film thickness drop phenomenon when a film is formed on a substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of processing a substrate, comprising:
    forming a SiOCN film on a concavo-convex structure formed on a surface of the substrate by performing a cycle a predetermined number of times, the cycle including non-simultaneously performing:
    (a) forming a first layer by supplying a precursor including hexachlorodisilane to the substrate;
    (b) forming a second layer by supplying a first reactant including triethylamine to the substrate so that a substance obtained by decomposing a portion of the first reactant is adsorbed on the first layer; and
    (c) forming a third layer by supplying a second reactant, which contains oxygen, to the substrate to oxidize the second layer,
    wherein a supply time of the first reactant in (b) per cycle is set to be 10 to 15 times a supply time of the precursor in (a) per cycle, and set to be 10 to 20 times a supply time of the second reactant in (c) per cycle.

2. The method according to claim 1, wherein in (b), the first reactant is supplied until at least one of a nitrogen concentration and a carbon concentration in an adsorption layer of the substance formed on each of at least an upper surface, a side surface and a lower surface of the concavo-convex structure is equalized.

3. The method according to claim 1, wherein in (b), in a period of performing one cycle, the first reactant is intermittently supplied.

4. The method according to claim 3, wherein a supply time of the first reactant per pulse in (b) in one cycle is set to be shorter than the supply time of the precursor in (a) per cycle.

5. The method according to claim 3, wherein a supply time of the first reactant per pulse in (b) in one cycle is set to be shorter than the supply time of the second reactant in (c) per cycle.

6. The method according to claim 1, wherein in (b), in a period of performing one cycle, the act of supplying the first reactant and a purge operation of purging an interior of a process chamber are alternately and repeatedly performed multiple times.

7. A method of manufacturing a semiconductor device comprising the method of claim 1.

8. The method according to claim 1, wherein the supply time of the first reactant in (b) per cycle is set to be equal to or longer than 100 seconds.

9. The method according to claim 1, wherein the supply time of the first reactant in (b) per cycle is set to be equal to or longer than 130 seconds.

10. The method according to claim 1, wherein the supply time of the first reactant in (b) per cycle is set to be equal to or longer than 150 seconds.

11. The method according to claim 1, wherein the supply time of the first reactant in (b) per cycle is set to be equal to or longer than 195 seconds.

12. A non-transitory computer-readable recording medium storing a program that causes a computer to perform a process in a substrate processing apparatus, the process comprising:
    forming a SiOCN film on a concavo-convex structure formed on a surface of a substrate by performing a cycle a predetermined number of times, the cycle including non-simultaneously performing:
    (a) forming a first layer by supplying a precursor including hexachlorodisilane to the substrate;
    (b) forming a second layer by supplying a first reactant including triethylamine to the substrate so that a substance obtained by decomposing a portion of the first reactant is adsorbed on the first layer; and
    (c) forming a third layer by supplying a second reactant, which contains oxygen, to the substrate to oxidize the second layer,
    wherein a supply time of the first reactant in (b) per cycle is set to be 10 to 15 times a supply time of the precursor in (a) per cycle, and set to be 10 to 20 times a supply time of the second reactant in (c) per cycle.

* * * * *